(12) United States Patent
Lee et al.

(10) Patent No.: US 11,462,276 B2
(45) Date of Patent: Oct. 4, 2022

(54) SEMICONDUCTOR MEMORY DEVICE AND OPERATING METHOD THEREOF

(71) Applicant: SK hynix Inc., Gyeonggi-do (KR)

(72) Inventors: Hee Youl Lee, Gyeonggi-do (KR); Young Hwan Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/197,681

(22) Filed: Mar. 10, 2021

(65) Prior Publication Data

US 2022/0076761 A1 Mar. 10, 2022

(30) Foreign Application Priority Data

Sep. 4, 2020 (KR) .................. 10-2020-0113413

(51) Int. Cl.
*G11C 11/34* (2006.01)
*G11C 16/26* (2006.01)
*G11C 16/08* (2006.01)
*G11C 16/04* (2006.01)

(52) U.S. Cl.
CPC .......... *G11C 16/26* (2013.01); *G11C 16/0483* (2013.01); *G11C 16/08* (2013.01)

(58) Field of Classification Search
CPC ......... G11C 16/10; G11C 16/30; G11C 16/12; G11C 16/0483

USPC ............................................. 365/185.18, 211
See application file for complete search history.

(56) References Cited

U.S. PATENT DOCUMENTS 9,570,176 B2 * 2/2017 Jung ....................... G11C 16/26
2011/0286274 A1 * 11/2011 Chang ................ G11C 16/0483
365/185.17

FOREIGN PATENT DOCUMENTS

KR 10-2019-0102508 9/2019

* cited by examiner

*Primary Examiner* — Son T Dinh
(74) *Attorney, Agent, or Firm* — IP & T Group LLP

(57) ABSTRACT

Provided herein may be a semiconductor memory device. The semiconductor memory device may include a memory cell array, a peripheral circuit, and control logic. The memory cell array includes a plurality of memory cells. The peripheral circuit performs a read operation on the memory cells. The control logic controls the read operation of the peripheral circuit. During the read operation, the control logic controls the peripheral circuit so that a read voltage is applied to a selected word line among a plurality of word lines coupled to the memory cells, a first pass voltage is applied to an unselected word line disposed adjacent to the selected word line and a second pass voltage is applied to an unselected word line that is not disposed adjacent thereto. The peripheral circuit adjusts a magnitude of the first or second pass voltage based on a temperature of the semiconductor memory device.

26 Claims, 15 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2020-0113413 filed on Sep. 4, 2020, the entire disclosure of which is incorporated by reference herein.

BACKGROUND

1. Technical Field

Various embodiments of the present disclosure generally relate to an electronic device, and more particularly to a semiconductor memory device.

2. Related Art

A memory device may have a two-dimensional (2D) structure in which strings are horizontally arranged on a semiconductor substrate. Alternatively, the memory device may have a three-dimensional (3D) structure in which strings are vertically stacked on a semiconductor substrate. Since the memory device having a 2D structure is reaching its physical scaling limit (i.e., limit in the degree of integration), a 3D memory device including a plurality of memory cells vertically stacked on a semiconductor substrate has been produced.

SUMMARY

Various embodiments of the present disclosure are directed to a semiconductor memory device having improved read performance depending on temperature change.

An embodiment of the present disclosure may provide for a semiconductor memory device. The semiconductor memory device may include a memory cell array, a peripheral circuit, and a control logic. The memory cell array may include a plurality of memory cells. The peripheral circuit may be configured to perform a read operation on the plurality of memory cells. The control logic may be configured to control the read operation of the peripheral circuit. During the read operation, the control logic may control the peripheral circuit so that a read voltage is applied to a selected word line, among a plurality of word lines coupled to the plurality of memory cells, a first pass voltage is applied to an unselected word line disposed adjacent to the selected word line, among the plurality of word lines, and a second pass voltage is applied to an unselected word line that is not disposed adjacent to the selected word line, among the plurality of word lines. The peripheral circuit may be further configured to adjust a magnitude of the first pass voltage or a magnitude of the second pass voltage based on a temperature of the semiconductor memory device.

In an embodiment, the peripheral circuit may include a voltage generator, an address decoder, a read and write circuit, and a temperature sensor. The voltage generator may be configured to generate the read voltage, the first pass voltage, and the second pass voltage. The address decoder may be configured to transfer the read voltage, the first pass voltage, and the second pass voltage to the selected word line, the unselected word line disposed adjacent to the selected word line and the unselected word line that is not disposed adjacent to the selected word line, respectively. The read and write circuit may be configured to sense threshold voltages of memory cells coupled to the selected word line. The temperature sensor may be configured to sense the temperature and generate a temperature code based on the temperature. The voltage generator may be further configured to adjust the magnitude of the first pass voltage or the magnitude of the second pass voltage based on the temperature code.

In an embodiment, the peripheral circuit may decrease the magnitude of the second pass voltage as the temperature rises.

In an embodiment, the peripheral circuit may increase the magnitude of the first pass voltage as the temperature rises.

In an embodiment, the peripheral circuit may keep the first pass voltage constant regardless of the temperature.

In an embodiment, the peripheral circuit may decrease the magnitude of the first pass voltage as the temperature rises.

In an embodiment, the peripheral circuit may adjust the magnitudes of the first pass voltage and the second pass voltage so that an absolute value of a slope of the second pass voltage depending on the rise of the temperature is greater than an absolute value of a slope of the first pass voltage depending on the rise.

An embodiment of the present disclosure may provide for a semiconductor memory device. The semiconductor memory device may include a memory cell array, a peripheral circuit, and a control logic. The memory cell array may include a plurality of memory cells. The peripheral circuit may be configured to perform a read operation on the plurality of memory cells. The control logic may be configured to control the read operation of the peripheral circuit. During the read operation, the control logic may control the peripheral circuit so that a read voltage is applied to a selected word line among a plurality of word lines coupled to the plurality of memory cells and so that a first pass voltage is applied to an unselected word line disposed adjacent to the selected word line in a direction of a drain select line among the plurality of word lines, a second pass voltage is applied to an unselected word line disposed adjacent to the selected word line in a direction of a source select line among the plurality of word lines, and a third pass voltage is applied to an unselected word line that is not disposed adjacent to the selected word line, among the plurality of word lines. The peripheral circuit may be further configured to adjust a magnitude of at least one of the first pass voltage, the second pass voltage and the third pass voltage based on a temperature of the semiconductor memory device.

In an embodiment, the peripheral circuit may include a voltage generator, an address decoder, a read and write circuit, and a temperature sensor. The voltage generator may be configured to generate the read voltage and the first pass voltage, the second pass voltage and the third pass voltage. The address decoder may be configured to transfer the read voltage and the first pass voltage, the second pass voltage and the third pass voltage to the selected word line, the unselected word line disposed adjacent to the selected word line in the direction of the drain select line, the unselected word line disposed adjacent to the selected word line in the direction of the source select line and the unselected word line that is not disposed adjacent to the selected word line, respectively. The read and write circuit may be configured to sense threshold voltages of memory cells coupled to the selected word line. The temperature sensor may be configured to sense the temperature and generate a temperature code based on the temperature. The voltage generator may be further configured to adjust the magnitude of at least one of the first to third pass voltages based on the temperature code.

In an embodiment, the peripheral circuit may decrease the magnitude of the third pass voltage as the temperature rises.

In an embodiment, the peripheral circuit may increase the magnitudes of the first and second pass voltages as the temperature rises.

In an embodiment, the peripheral circuit may adjust the magnitudes of the first pass voltage and the second pass voltage so that a slope of the first pass voltage depending on the rise of the temperature is greater than a slope of the second pass voltage depending on the rise.

In an embodiment, the peripheral circuit may adjust the magnitudes of the first pass voltage and the second pass voltage so that a slope of the second pass voltage depending on the rise of the temperature is greater than a slope of the first pass voltage depending on the rise.

In an embodiment, the peripheral circuit may increase the magnitude of the first pass voltage as the temperature rises. The peripheral circuit may keep the second pass voltage constant regardless of the temperature.

In an embodiment, the peripheral circuit may increase the magnitude of the second pass voltage as the temperature. The peripheral circuit may keep the first pass voltage constant regardless of the temperature.

In an embodiment, the peripheral circuit may increase the magnitude of the first pass voltage and decrease the magnitude of the second pass voltage as the temperature rises.

In an embodiment, the peripheral circuit may adjust the magnitudes of the second pass voltage and the third pass voltage so that an absolute value of a slope of the third pass voltage depending on the rise of the temperature is greater than an absolute value of a slope of the second pass voltage depending on the rise.

In an embodiment, the peripheral circuit may decrease the magnitude of the first pass voltage and increase the magnitude of the second pass voltage as the temperature rises.

In an embodiment, the peripheral circuit may adjust the magnitudes of the first pass voltage and the third pass voltage so that an absolute value of a slope of the third pass voltage depending on the rise of the temperature is greater than an absolute value of a slope of the first pass voltage depending on the rise.

An embodiment of the present disclosure may provide for a semiconductor memory device. The semiconductor memory device may include a memory cell array, a peripheral circuit, and a control logic. The memory cell array may include a plurality of memory cells. The peripheral circuit may be configured to perform a read operation on the plurality of memory cells. The control logic may be configured to control the read operation of the peripheral circuit. During the read operation, the control logic may control the peripheral circuit so that a read voltage is applied to a selected word line among a plurality of word lines coupled to the plurality of memory cells and so that an adjacent pass voltage is applied to an unselected word line disposed adjacent to the selected word line among the plurality of word lines, and a plurality of different non-adjacent pass voltages are applied to unselected word lines that are not disposed adjacent to the selected word line among the plurality of word lines. The peripheral circuit may be further configured to adjust a magnitude of the adjacent pass voltage or magnitudes of the non-adjacent pass voltages based on a temperature of the semiconductor memory device.

An embodiment of the present disclosure may provide for an operating method of a semiconductor memory device including a memory cell string of memory cells. The operating method may include grouping non-target word lines into near and far groups each including one or more word lines, applying an operation voltage to the target word line, applying one or more near voltages respectively to the near group, and applying one or more far voltages respectively to the far group. The near group may be disposed closer to a target word line than the far group and the target and non-target word lines may be coupled respectively to the memory cells. The applying of the far voltages may include changing the far voltages in negative proportion to the temperature. The applying of the near voltages may include changing at least one of the near voltages in positive proportion to the temperature.

In an embodiment, the applying of the near voltages may further include changing another one of the near voltages in different positive proportion to the temperature.

In an embodiment, the applying of the near voltages may further include keeping another one of the near voltages constant with reference to the temperature.

In an embodiment, the applying of the near voltages may further include changing another one of the near voltages in negative proportion to the temperature. Gradients of the far voltages during the changing of the far voltages may be greater than a gradient of the another near voltage during the changing of the another near voltage.

An embodiment of the present disclosure may provide for an operating method of a semiconductor memory device including a memory cell string of memory cells respectively coupled to word lines. The operating method may include grouping remaining word lines into near and far groups each including one or more word lines, applying an operation voltage to the target word line, applying one or more near voltages respectively to the near group, and applying one or more far voltages respectively to the far group. The near group may be disposed closer to a target word line than the far group. The applying the far voltages may include changing the far voltages in negative proportion to the temperature. The applying the near voltages may include keeping at least one of the near voltages constant with reference to the temperature.

In an embodiment, the applying the near voltages may further include changing another one of the near voltages in positive proportion to the temperature.

An embodiment of the present disclosure may provide for an operating method of a semiconductor memory device including a memory cell string of memory cells respectively coupled to word lines. The operating method may include grouping remaining word lines into near and far groups each including one or more word lines, applying an operation voltage to the target word line, applying one or more near voltages respectively to the near group, and applying one or more far voltages respectively to the far group. The near group may be disposed closer to a target word line than the far group. The applying the far voltages may include changing the far voltages in negative proportion to the temperature. The applying the near voltages may include changing at least one of the near voltages in negative proportion to the temperature. Gradients of the far voltages during the changing of the far voltages may be greater than a gradient of the near voltage during the changing of the near voltage.

In an embodiment, the applying the near voltages may further include changing another one of the near voltages in positive proportion to the temperature.

DETAILED DESCRIPTION

Specific structural or functional descriptions in the embodiments of the present disclosure introduced in this specification or application are exemplified to describe various embodiments of the present disclosure. Various embodiments of the present disclosure may be practiced in various forms, and should not be construed as being limited to the embodiments described in the specification or application.

Figure 1:
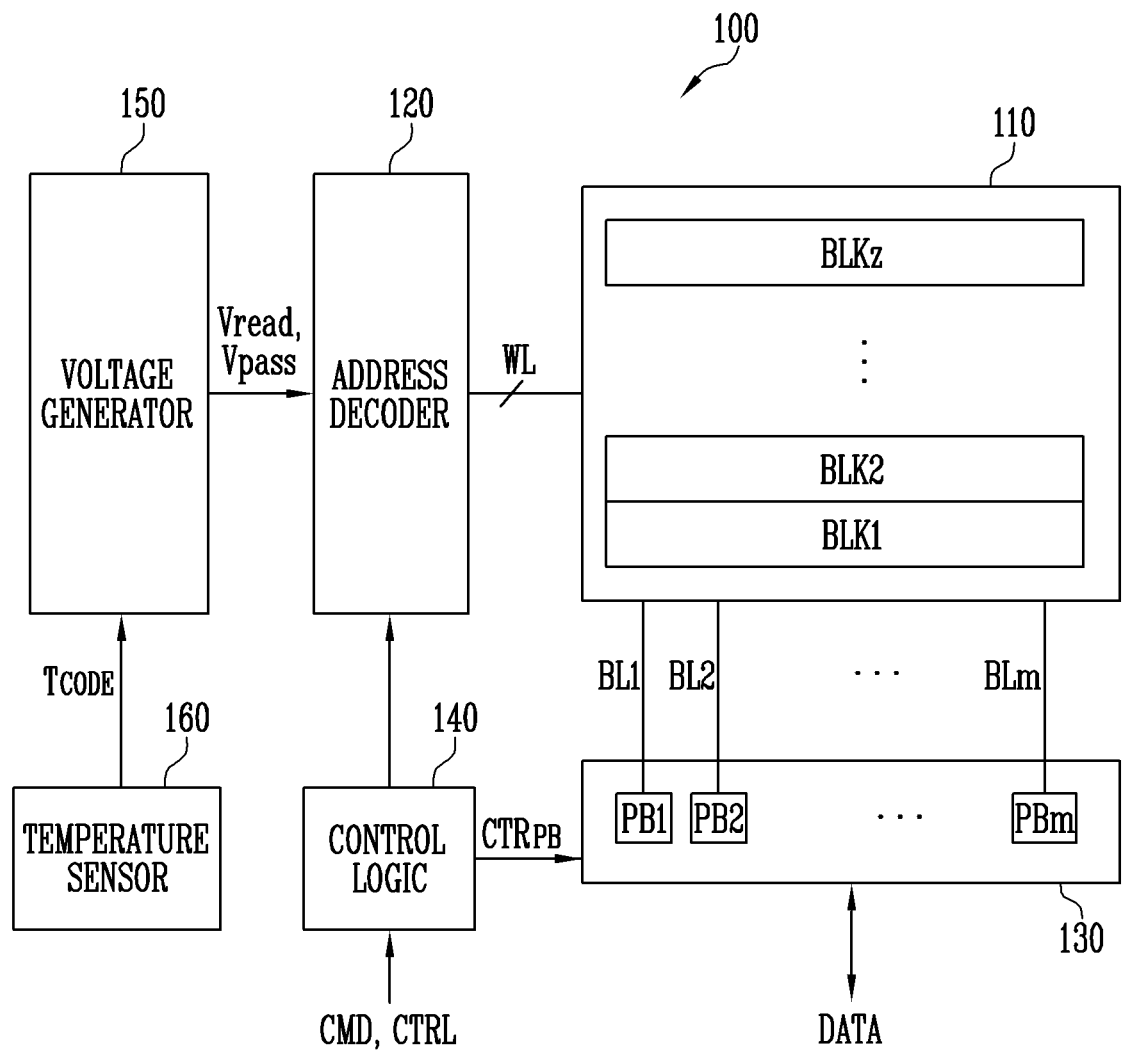
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, a control logic 140, a voltage generator 150, and a temperature sensor 160.

The memory cell array 110 may include a plurality of memory blocks BLK1 to BLKz. The memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In accordance with an embodiment, the memory cell array 110 may include a plurality of memory cells each of which stores 5 or more bits of data.

The address decoder 120, the read and write circuit 130, the control logic 140, the voltage generator 150, and the temperature sensor 160 are operated as peripheral circuits for driving the memory cell array 110. The address decoder 120 is coupled to the memory cell array 110 through the word lines WL. The address decoder 120 may be operated under the control of the control logic 140. The address decoder 120 receives addresses through an input/output buffer (not illustrated) provided in the semiconductor memory device 100.

The address decoder 120 may decode a block address, among the received addresses. The address decoder 120 selects at least one memory block based on the decoded block address. Further, when a read voltage apply operation is performed during a read operation, the address decoder 120 may apply a read voltage Vread, generated by the voltage generator 150, to a selected word line of a selected memory block, and may apply a pass voltage Vpass to remaining word lines, that is, unselected word lines. Further, during a program verify operation, the address decoder 120 may apply a verify voltage, generated by the voltage generator 150, to the selected word line of the selected memory block, and may apply the pass voltage Vpass to the remaining word lines, that is, unselected word lines.

The address decoder 120 may decode a column address among the received addresses. The address decoder 120 may transmit the decoded column address to the read and write circuit 130.

The read and program operations of the semiconductor memory device 100 are each performed on a page basis. Addresses received in response to a request for read and program operations may include a block address, a row address, and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm are coupled to the memory cell array 110 through the bit lines BL1 to BLm. In order to sense threshold voltages of the memory cells during a read operation and a program verify operation, each of the page buffers PB1 to PBm may sense, through a sensing node, a change in the amount of flowing current depending on the program state of a corresponding memory cell and latch the sensed change as sensing data while continuously supplying sensing current to the bit lines coupled to the memory cells. The read and write circuit 130 may be operated in response to page buffer control signals $CTR_{PB}$ output from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page registers).

The control logic 140 is coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Also, the control logic 140 may output a control signal $CTR_{PB}$ for controlling the plurality of page buffers PB1 to PBm included in the read and write circuit 130. The control logic 140 may control the read and write circuit 130 to perform a read operation of the memory cell array 110.

The voltage generator 150 may generate the read voltage Vread and the pass voltage Vpass required for a read operation in response to the control signal output from the control logic 140. In addition, the voltage generator 150 may generate voltages for generating various control signals required to control the operation of the semiconductor memory device.

The temperature sensor 160 may sense the temperature of the semiconductor memory device 100, may generate a temperature code $T_{CODE}$ based on the result of sensing, and transfer the temperature code to the voltage generator 150. The temperature code $T_{CODE}$ may be a digital code indicating the temperature of the semiconductor memory device. The voltage generator 150 may control at least some voltages required for the operation of the semiconductor memory device 100 based on the temperature code $T_{CODE}$. For example, the voltage generator 150 may control the read voltage Vread or the pass voltage Vpass that is used for a read operation based on the temperature code $T_{CODE}$.

Generally, the operating characteristics of the memory cells included in the memory cell array 110 may vary with temperature change of the semiconductor device 100. In this case, when the read voltage Vread or the pass voltage Vpass that is determined regardless of the temperature of the semiconductor device 100 is used, the reliability of a read operation may be deteriorated. In the semiconductor memory device 100 according to an embodiment of the present disclosure, the voltage level of the pass voltage Vpass to be used for a read operation is controlled depending on the temperature change, and thus the problem of deteriorating the reliability of the read operation depending on the temperature change may be prevented.

Figure 2:
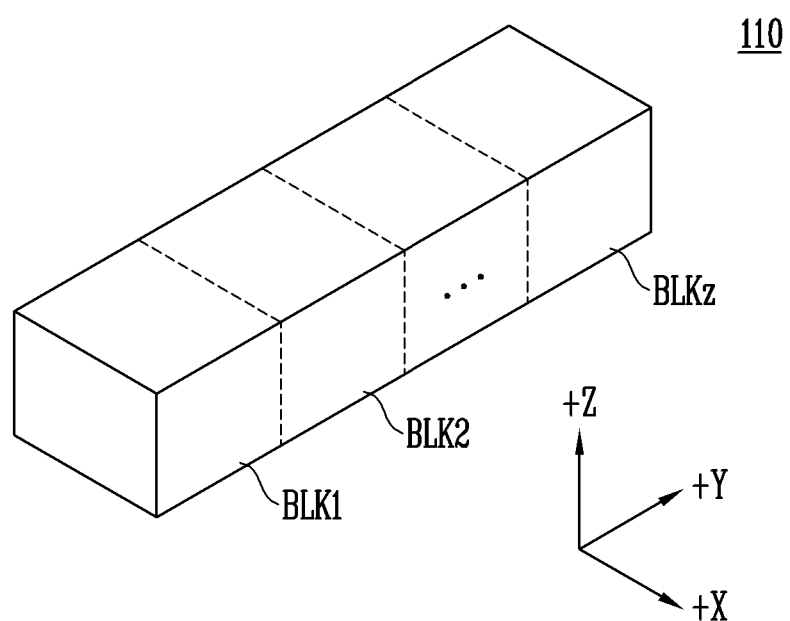
FIG. 2 is a block diagram illustrating an embodiment of a memory cell array 110 of FIG. 1.

FIG. 2 is a block diagram illustrating an embodiment of the memory cell array 110 of FIG. 1.

Referring to FIG. 2, the memory cell array 110 includes a plurality of memory blocks BLK1 to BLKz. Each memory block has a three-dimensional (3D) structure. Each of the memory blocks may include a plurality of memory cells stacked on a substrate. The plurality of memory cells are arranged in +X, +Y, and +Z directions. The structure of each memory block will be described in more detail below with reference to FIGS. 3 and 4.

Figure 3:
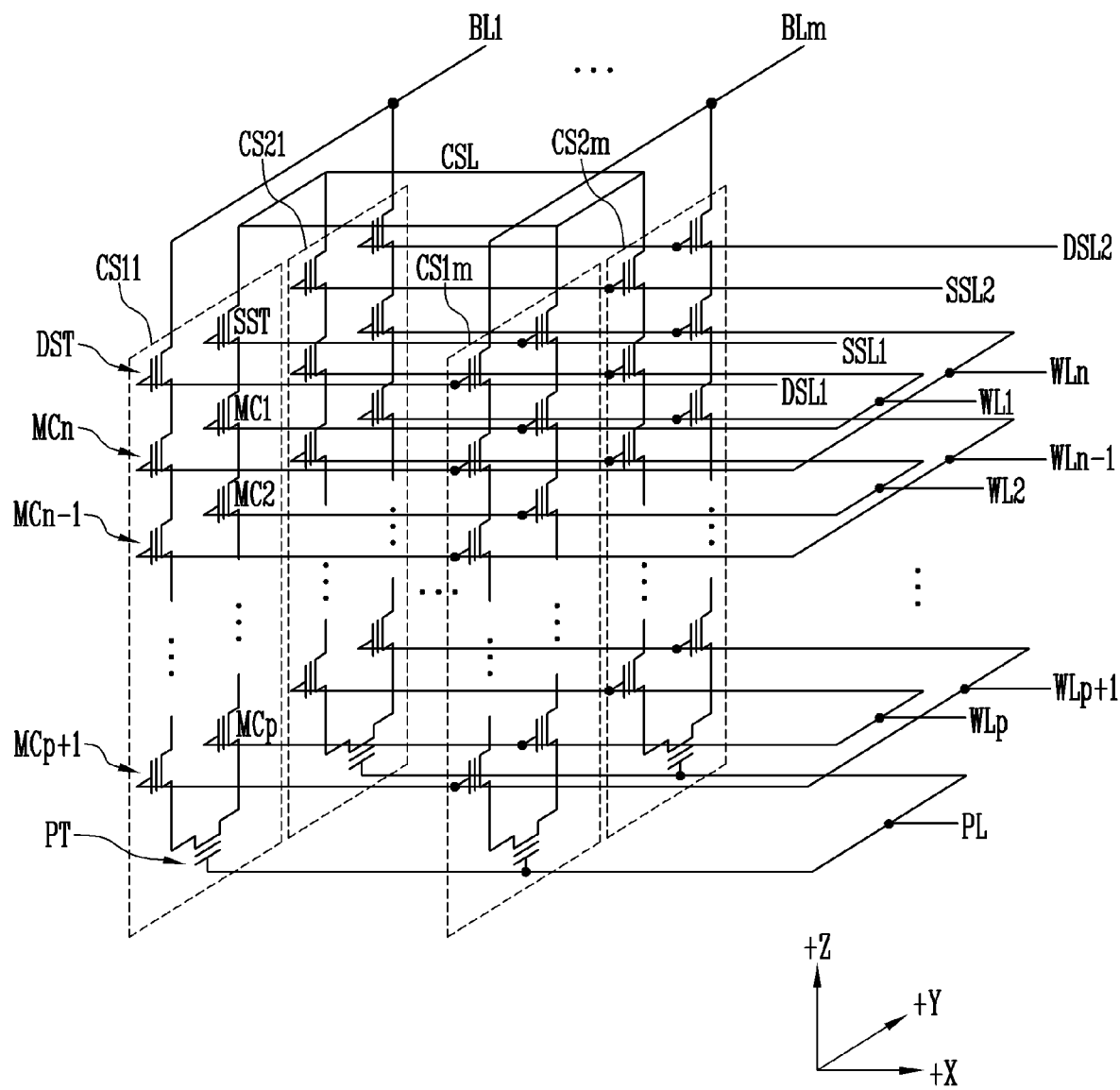
FIG. 3 is a circuit diagram illustrating any one memory block BLKa of memory blocks BLK1 to BLKz of FIG. 2.

FIG. 3 is a circuit diagram illustrating a memory block BLKa of memory blocks BLK1 to BLKz of FIG. 2.

Referring to FIG. 3, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., a positive (+) X direction). In FIG. 3, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, source select transistors of the cell strings CS11 to CS1m in a first row are coupled to a first source select line SSL1. Source select transistors of the cell strings CS21 to CS2m in a second row are coupled to a second source select line SSL2.

In an embodiment, source select transistors of the cell strings CS11 to CS1m and CS21 to CS2m may be coupled in common to one source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite to a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. Gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The Drain select transistors DST of the cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 3, the cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting one of the drain select lines DSL1 and DSL2. One page may be selected from the selected cell strings by selecting one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may be decreased, whereas the reliability of operation of the memory block BLKa may be deteriorated.

In order to efficiently control the one or more dummy memory cells, respective dummy memory cells may have required threshold voltages. Before or after an erase operation on the memory block BLKa is performed, program operations may be performed on all or some of the dummy memory cells. When the erase operation is performed after the program operations have been performed, the respective dummy memory cells may have required threshold voltages by controlling voltages to be applied to dummy word lines coupled to respective dummy memory cells.

Figure 4:
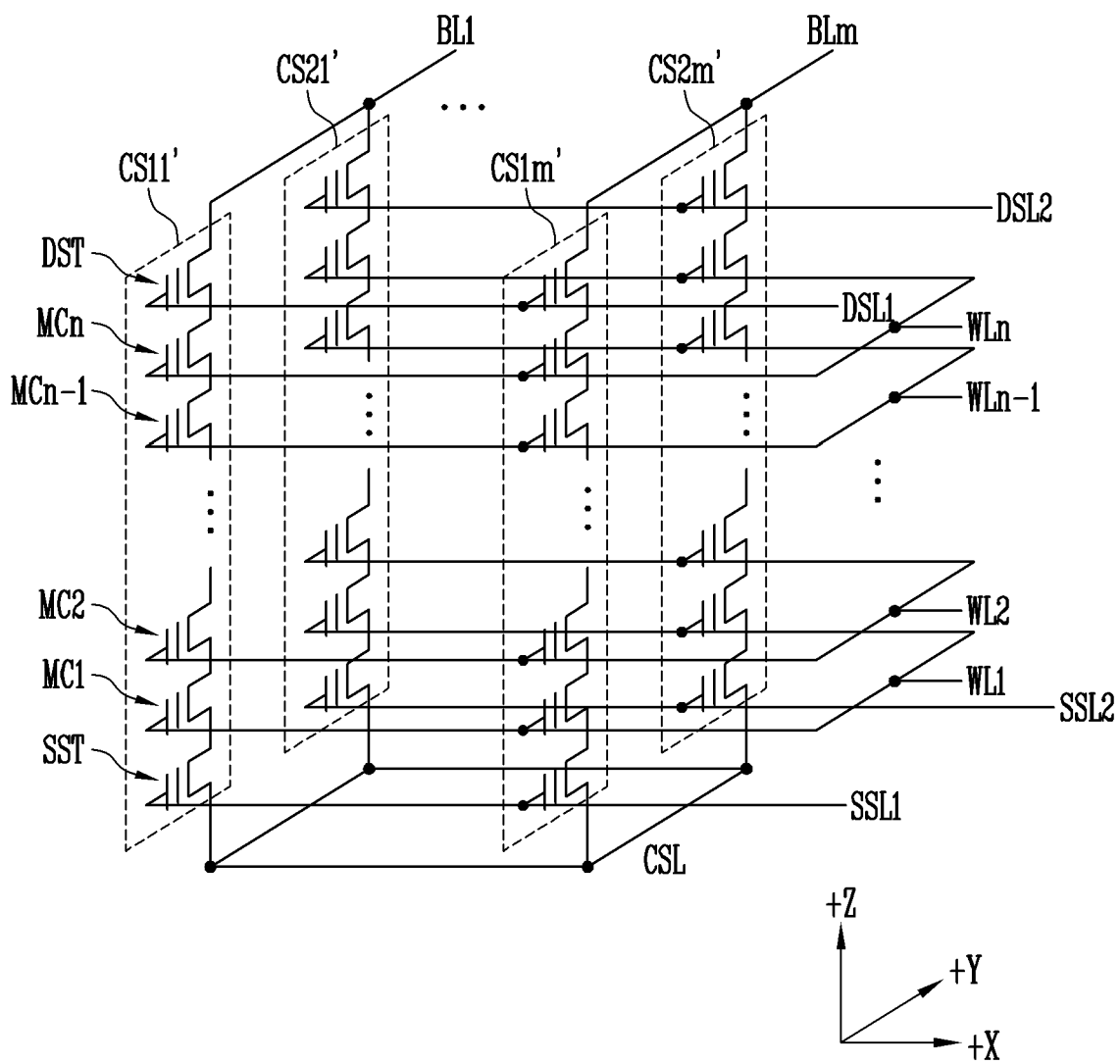
FIG. 4 is a circuit diagram illustrating an example of a memory block BLKb of the memory blocks BLK1 to BLKz of FIG. 2.

FIG. 4 is a circuit diagram illustrating an example of a memory block BLKb of the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' extends along a positive Z (+Z) direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 4 has a circuit similar to that of the memory block BLKa of FIG. 3 except that a pipe transistor PT is excluded from each cell string in FIG. 4.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer dummy memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the dummy memory cells may have required threshold voltages by controlling the voltages to be applied to the dummy word lines coupled to respective dummy memory cells.

Figure 5:
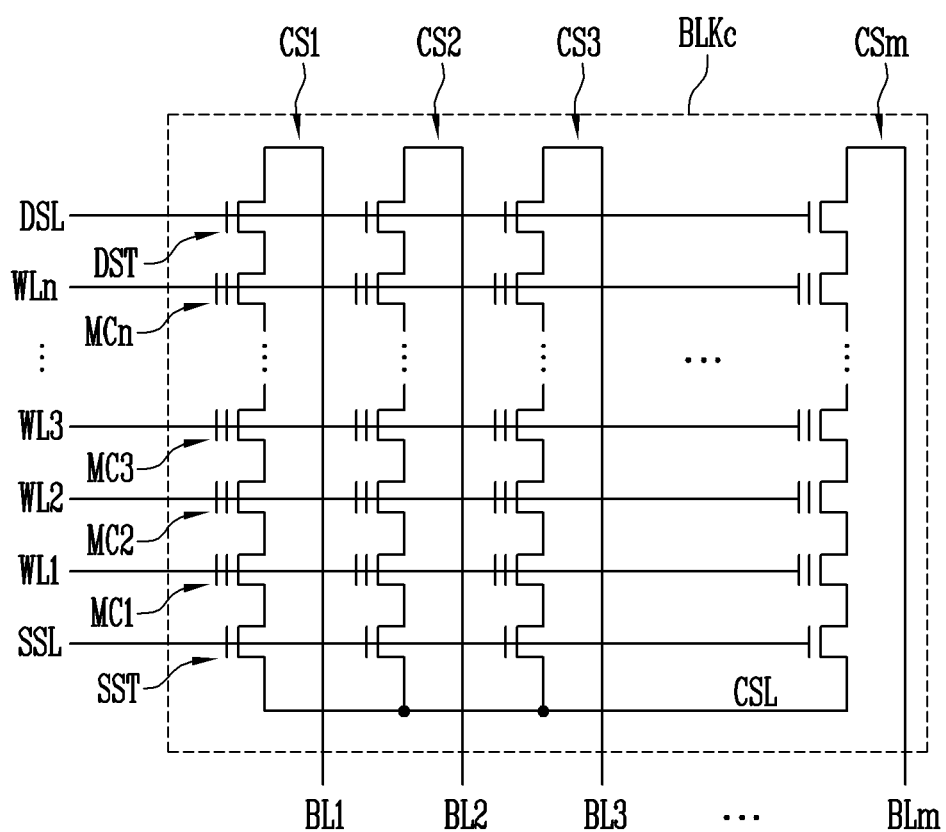
FIG. 5 is a circuit diagram illustrating an example of a memory block BLKc of a plurality of memory blocks BLK1 to BLKz included in the memory cell array 110 of FIG. 1.

FIG. 5 is a circuit diagram illustrating an example of a memory block BLKc of the memory blocks BLK1 to BLKz included in the memory cell array 110 of FIG. 1.

Referring to FIG. 5, the memory block BLKc may include a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As illustrated in FIGS. 2 to 4, the memory cell array 110 of the semiconductor memory device 100 may be implemented as a memory cell array having a 3D structure. Further, as illustrated in FIG. 5, the memory cell array 110 of the semiconductor memory device 100 may be implemented as a memory cell array having a 2D structure.

Figure 6:
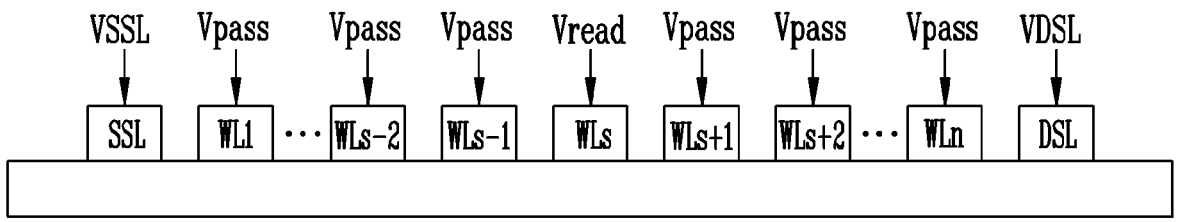
FIG. 6 is a diagram describing a read operation of a semiconductor memory device.

FIG. 6 is a diagram describing a read operation of a semiconductor memory device. Referring to FIG. 6, a cell string CS included in the memory cell array of the semiconductor memory device is illustrated. The cell string CS of FIG. 6 may be one of the cell strings CS11 to CS1m and CS21 to CS2m illustrated in FIG. 3. Alternatively, the cell string CS of FIG. 6 may be one of the cell strings CS11' to CS1m' and CS21' to CS2m' illustrated in FIG. 4. Alternatively, the cell string CS of FIG. 6 may be one of the cell strings CS1 to CSm illustrated in FIG. 5. In FIG. 6, a source select line SSL, a plurality of word lines WL1 to WLn, and a drain select line DSL, which are coupled to the cell string CS, are illustrated, and illustration of a common source line and bit lines is omitted.

During a read operation of the semiconductor memory device, a read voltage Vread may be applied to a selected word line WLs and a pass voltage Vpass may be applied to unselected word lines WL1 to WLs−1 and WLs+1 to WLn, among the word lines WL1 to WLn coupled to the cell string CS. During the read operation, based on the read voltage Vread applied to the selected word line WLs, information is read about whether a threshold voltage of each memory cell coupled to the selected word line WLs is greater than the read voltage Vread. During the read operation, the pass voltage Vpass applied to the unselected word lines WL1 to WLs−1 and WLs+1 to WLn may be greater than threshold voltages of all memory cells coupled to the unselected word lines WL1 to WLs−1 and WLs+1 to WLn. A source select line voltage VSSL applied to the source select line SSL during the read operation may be a voltage for turning on a source select transistor. Further, a drain select line voltage VDSL applied to the drain select line DSL during the read operation may be a voltage for turning on a drain select transistor.

Figure 7A:
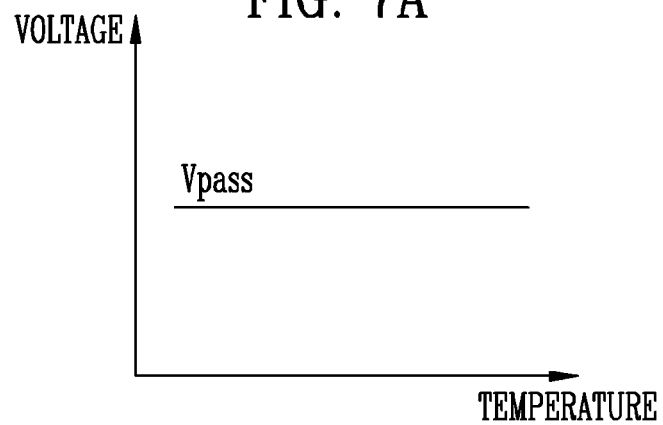
FIG. 7A is a graph illustrating the relationship between a pass voltage, used in a typical read operation, and temperature.
Figure 7B:
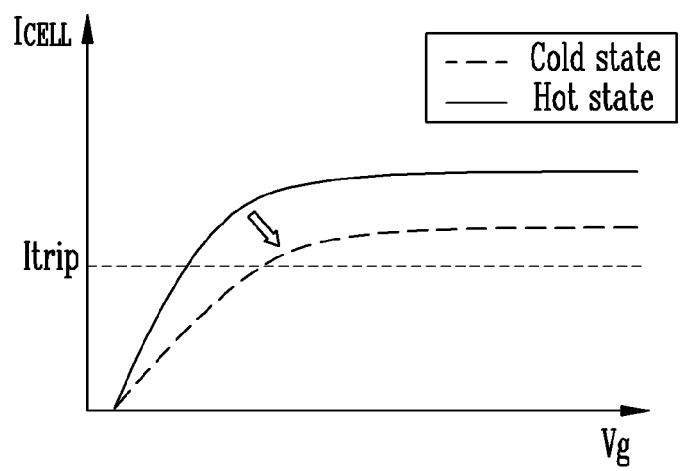
FIG. 7B is a graph illustrating the operating characteristics of a memory cell depending on temperature when the pass voltage of FIG. 7A is used.

FIG. 7A is a graph illustrating the relationship between a pass voltage used in a typical read operation, and temperature. FIG. 7B is a graph illustrating the operating characteristics of a memory cell depending on temperature when the pass voltage of FIG. 7A is used.

Referring to FIG. 7A, a constant value may be used as the magnitude of the pass voltage Vpass that is applied to unselected word lines WL1 to WLs−1 and WLs+1 to WLn in the typical read operation, regardless of the temperature change of the semiconductor device 100.

Referring to FIG. 7B, the relationship between a gate voltage Vg and a cell current $I_{CELL}$ depending on the temperature of the semiconductor memory device during a read operation or a program verify operation performed on a selected memory cell is illustrated.

As illustrated in FIG. 7B, when the temperature of the semiconductor memory device is higher, the cell current $I_{CELL}$ flowing through the memory cell provided with a gate voltage Vg is higher, whereas when the temperature of the semiconductor memory device is lower, the cell current $I_{CELL}$ flowing through the memory cell provided with the same gate voltage Vg is lower. That is, in the case where the semiconductor memory device is operated in a relatively high temperature state is compared with the case where the semiconductor memory device is operated in a relatively low temperature state, the cell current $I_{CELL}$ flowing through a memory cell that is a read target within the semiconductor memory device may vary with the temperature. Due to the difference between the cell currents $I_{CELL}$ affected by the temperature of the semiconductor device, it is difficult to accurately determine the threshold voltage of the selected memory cell during a read operation.

Figure 8A:
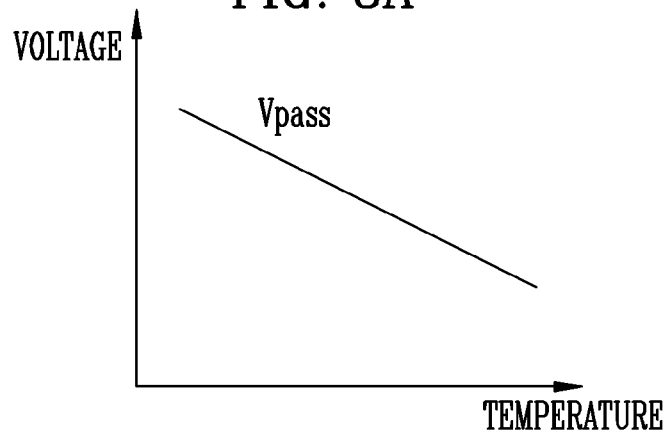
FIG. 8A is a graph illustrating the relationship between a pass voltage used in a read operation of a semiconductor memory device, and temperature according to an embodiment of the present disclosure.
Figure 8B:
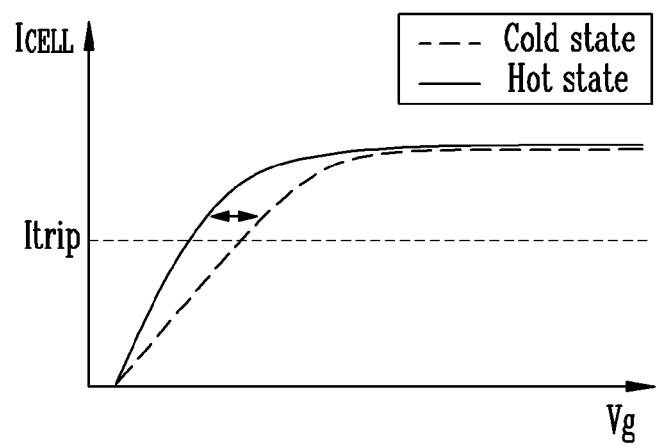
FIG. 8B is a graph illustrating the operating characteristics of a memory cell depending on temperature when the pass voltage of FIG. 8A is used.

FIG. 8A is a graph illustrating the relationship between a pass voltage, used in a read operation of a semiconductor memory device, and temperature according to an embodiment of the present disclosure. FIG. 8B is a graph illustrating the operating characteristics of a memory cell depending on the temperature of the semiconductor device 100 when the pass voltage of FIG. 8A is used.

Referring to FIG. 8A, during the read operation of the semiconductor memory device according to an embodiment of the present disclosure, the magnitude of a pass voltage Vpass that is applied to unselected word lines WL1 to WLs−1 and WLs+1 to WLn depending on the temperature of the semiconductor memory device 100 is illustrated. More specifically, when the temperature of the semiconductor memory device 100 is relatively high, a voltage having a relatively low value may be used as the pass voltage Vpass to be applied to the unselected word lines WL1 to WLs−1 and WLs+1 to WLn. In contrast, when the temperature of the semiconductor memory device 100 is relatively low, a voltage having a relatively high value may be used as the pass voltage Vpass to be applied to the unselected word lines WL1 to WLs−1 and WLs+1 to WLn.

Accordingly, as illustrated in FIG. 8B, the difference between the cell currents $I_{CELL}$ in the cases where the temperature of the semiconductor memory device is high and where the temperature of the semiconductor memory device is low may be reduced compared to the embodiment of FIG. 7B. In particular, at a gate voltage equal to or greater than a specific voltage level, the difference between the cell currents $I_{CELL}$ in the cases where the temperature of the semiconductor memory device is high and where the temperature of the semiconductor memory device is low is hardly present. However, even in this case, at a gate voltage less than the specific voltage level, the difference between the cell currents $I_{CELL}$ in the cases where the temperature of the semiconductor memory device is high and where the temperature of the semiconductor memory device is low is present. In particular, there is the difference between slopes of the gate voltage Vg versus cell current $I_{CELL}$, which results in the difference between cell currents corresponding to the read voltage applied to the gate of the selected memory cell during a read operation. Consequently, due to the difference between the cell currents $I_{CELL}$, it is difficult to accurately determine the threshold voltage of the selected memory cell during a read operation.

Figure 9:
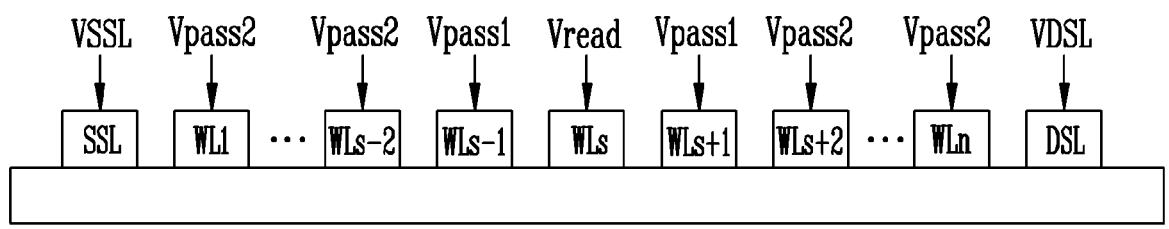
FIG. 9 is a diagram describing a read operation of a semiconductor memory device according to an embodiment of the present disclosure.

FIG. 9 is a diagram describing a read operation of a semiconductor memory device according to an embodiment of the present disclosure. Referring to FIG. 9, a cell string CS included in the memory cell array of the semiconductor memory device is illustrated. The cell string CS of FIG. 9 may be any one of the cell strings CS11 to CS1m and CS21 to CS2m illustrated in FIG. 3. Alternatively, the cell string CS of FIG. 9 may be any one of the cell strings CS11' to CS1m' and CS21' to CS2m' illustrated in FIG. 4. Alternatively, the cell string CS of FIG. 9 may be any one of the cell strings CS1 to CSm illustrated in FIG. 5. In FIG. 9, a source select line SSL, a plurality of word lines WL1 to WLn, and a drain select line DSL, which are coupled to the cell string CS, are illustrated, and illustration of a common source line and bit lines is omitted.

During the read operation of the semiconductor memory device, a read voltage Vread is applied to a selected word line WLs, among the word lines WL1 to WLn coupled to the cell string CS. Meanwhile, a first pass voltage Vpass1 may be applied to word lines WLs−1 and WLs+1 disposed adjacent to the selected word line WLs, among unselected word lines WL1 to WLs−1 and WLs+1 to WLn. A second pass voltage Vpass2 may be applied to the remaining unselected word lines WL1 to WLs−2 and WLs+2 to WLn other than the word lines WLs−1 and WLs+1 disposed adjacent to the selected word line WLs, among unselected word lines WL1 to WLs−1 and WLs+1 to WLn.

In the present specification, the first pass voltage Vpass1 that is applied to the word lines WLs−1 and WLs+1 which are disposed adjacent to the selected word line WLs may be referred to as an "adjacent pass voltage", and the second pass voltage Vpass2 that is applied to the unselected word lines WL1 to WLs−2 and WLs+2 to WLn which are not disposed adjacent to the selected word line WLs may be referred to as a "non-adjacent pass voltage."

During the read operation, based on the read voltage Vread applied to the selected word line WLs, information is read about whether a threshold voltage of each memory cell coupled to the selected word line WLs is greater than the read voltage Vread. During a read operation, the first and second pass voltages Vpass1 and Vpass2 that are applied to the unselected word lines WL1 to WLs−1 and WLs+1 to WLn may be voltages greater than the threshold voltages of all memory cells coupled to the unselected word lines WL1 to WLs−1 and WLs+1 to WLn. A source select line voltage VSSL applied to the source select line SSL during the read operation may be a voltage for turning on a source select transistor. Further, a drain select line voltage VDSL applied to the drain select line DSL during the read operation may be a voltage for turning on a drain select transistor. Although not illustrated, the control logic 140 may group the unselected word lines WL1 to WLs−1 and WLs+1 to WLn into a group, to which the adjacent pass voltage Vpass1 is to be applied, and a group, to which the non-adjacent pass voltage Vpass2 is to be applied, whenever the word line WLs is selected for each read operation.

In the semiconductor memory device 100 according to an embodiment of the present disclosure, the first pass voltage Vpass1 that is applied to the word lines WLs−1 and WLs+1 which are disposed adjacent to the selected word line WLs, among the unselected word lines WL1 to WLs−1 and WLs+1 to WLn, and the second pass voltage Vpass2 that is applied to the remaining unselected word lines WL1 to WLs−2 and WLs+2 to WLn, among the unselected word lines WL1 to WLs−1 and WLs+1 to WLn, may be separately used. A method of controlling the first pass voltage Vpass1 and the second pass voltage Vpass2 depending on the temperature of the semiconductor memory device 100 according to an embodiment of the present disclosure will be described below with reference to FIGS. 10A and 10B.

Figure 10A:
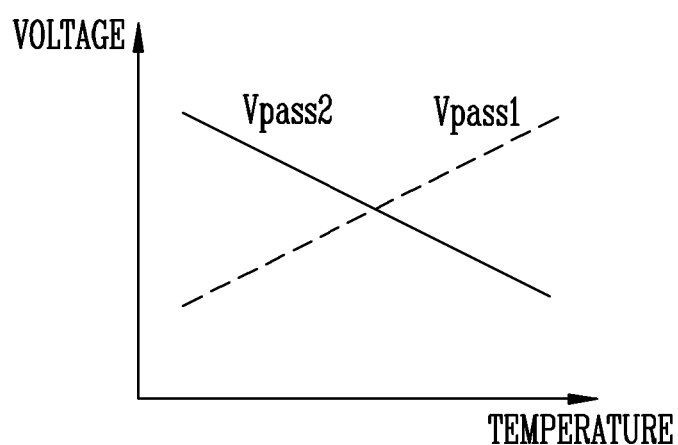
FIG. 10A is a graph illustrating the relationships between pass voltages, used in a read operation of a semiconductor memory device, and temperature according to an embodiment of the present disclosure.
Figure 10B:
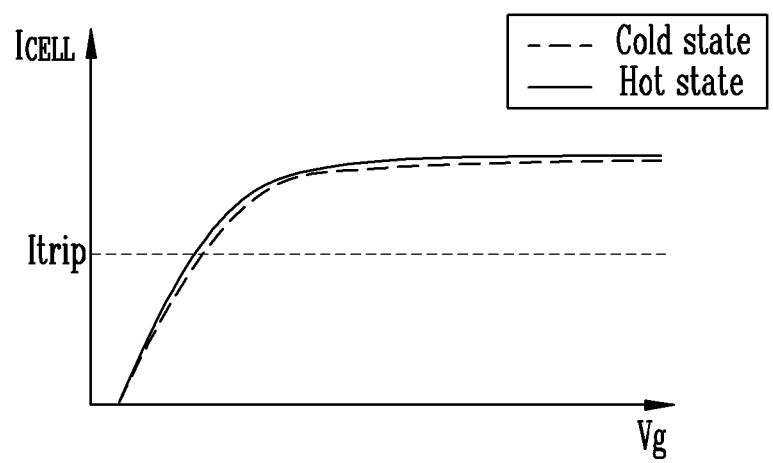
FIG. 10B is a graph illustrating the operating characteristics of a memory cell depending on temperature when the pass voltages of FIG. 10A are used.

FIG. 10A is a graph illustrating the relationships between pass voltages used in a read operation of a semiconductor memory device and temperature, according to an embodiment of the present disclosure. FIG. 10B is a graph illustrating the operating characteristics of a memory cell depending on temperature when the pass voltages of FIG. 10A are used.

Referring to FIG. 10A, during the read operation of the semiconductor memory device according to an embodiment of the present disclosure, the magnitudes of a first pass voltage Vpass1 and a second pass voltage Vpass2 that are applied to unselected word lines WL1 to WLs−1 and WLs+1 to WLn depending on the temperature of the semiconductor memory device 100 are illustrated. As described above with reference to FIG. 9, the first pass voltage Vpass1 may be applied to word lines WLs−1 and WLs+1 which are disposed adjacent to the selected word line WLs, among the unselected word lines WL1 to WLs−1 and WLs+1 to WLn, and the second pass voltage Vpass2 may be applied to the remaining unselected word lines WL1 to WLs−2 and WLs+2 to WLn, among the unselected word lines WL1 to WLs−1 and WLs+1 to WLn. In accordance with an embodiment of the present disclosure, as the temperature of the semiconductor device 100 rises, the magnitude of the first pass voltage Vpass1 increases and the magnitude of the second pass voltage Vpass2 decreases. In contrast, as the temperature falls, the magnitude of the first pass voltage Vpass1 decreases and the magnitude of the second pass voltage Vpass2 increases. Of the components of a cell current $I_{CELL}$ flowing through a memory cell selected as the target of the read operation among the memory cells included in the memory cell array 110 of the semiconductor memory device 100, a linear current component has high sensitivity to the first pass voltage Vpass1 that is applied to the unselected word lines WLs−1 and WLs+1 disposed adjacent to the selected memory cell. Accordingly, as the temperature rises, the first pass voltage Vpass1 may be increased. Meanwhile, the remaining unselected word lines WL1 to WLs−2 and WLs+2 to WLn, other than the unselected word lines WLs−1 and WLs+1 which are disposed adjacent to the selected word line, may act as a resistive factor to the cell current $I_{CELL}$ flowing through the selected memory cell. Accordingly, as the temperature rises, the second pass voltage Vpass2 may be decreased.

Accordingly, as illustrated in FIG. 10B, the difference between the cell currents $I_{CELL}$ in the cases where the temperature of the semiconductor memory device 100 is high and where the temperature of the semiconductor memory device 100 is low may be further reduced compared to the embodiment of FIG. 8B. In particular, not only at a gate voltage equal to or greater than a specific voltage level but also at a gate voltage less than the specific voltage level, the difference between the cell currents $I_{CELL}$ in the cases where the temperature of the semiconductor memory device is high and where the temperature of the semiconductor memory device is low may be minimized.

Figure 11A:
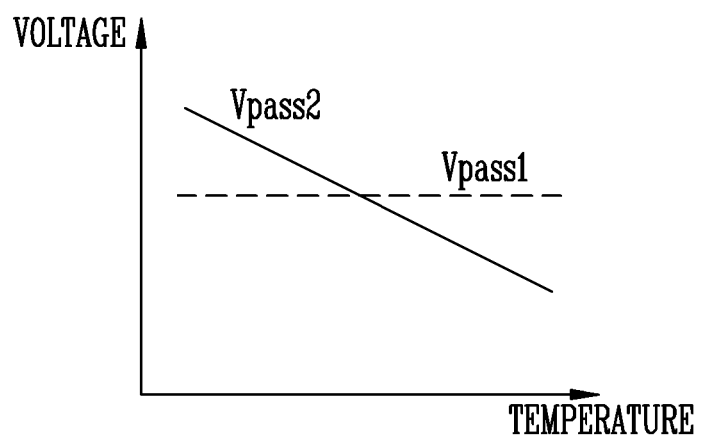
FIGS. 11A and 11B are graphs illustrating the relationships between pass voltages, used in a read operation of a semiconductor memory device, and temperature according to an embodiment of the present disclosure.
Figure 11B:
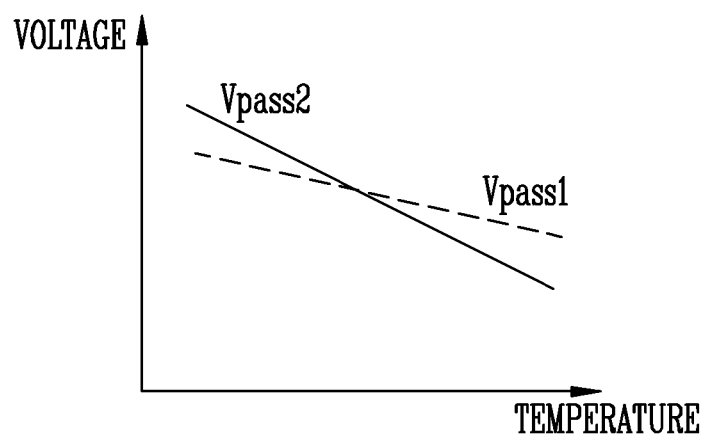

FIGS. 11A and 11B are graphs illustrating the relationships between pass voltages used in a read operation of a semiconductor memory device and temperature, according to an embodiment of the present disclosure, Referring to FIG. 11A, during the read operation of the semiconductor memory device according to an embodiment of the present disclosure, the magnitudes of a first pass voltage Vpass1 and a second pass voltage Vpass1 that are applied to unselected word lines WL1 to WLs−1 and WLs+1 to WLn depending on the temperature of the semiconductor memory device 100 are illustrated. As described above with reference to FIG. 9, the first pass voltage Vpass1 is applied to the word lines WLs−1 and WLs+1 which are disposed adjacent to the selected word line WLs, among the unselected word lines WL1 to WLs−1 and WLs+1 to WLn, and the second pass voltage Vpass2 is applied to the remaining unselected word lines WL1 to WLs−2 and WLs+2 to WLn, among the unselected word lines WL1 to WLs−1 and WLs+1 to WLn. In accordance with an embodiment of the present disclosure, the first pass voltage Vpass1 having a constant voltage level regardless of the temperature change of the semiconductor device 100 may be applied to the word lines WLs−1 and WLs+1 disposed adjacent to the selected word line WLs. In the case of the second pass voltage Vpass2, similar to the embodiment of FIG. 10A, as the temperature rises, the magnitude of the second pass voltage Vpass2 may be decreased, whereas as the temperature falls, the magnitude of the second pass voltage Vpass2 may be increased.

Referring to FIG. 11B, during the read operation of the semiconductor memory device according to an embodiment of the present disclosure, the magnitudes of a first pass voltage Vpass1 and a second pass voltage Vpass2 that are applied to unselected word lines WL1 to WLs−1 and WLs+1 to WLn depending on the temperature of the semiconductor memory device 100 are illustrated. In accordance with the embodiment of FIG. 11B, as the temperature rises, the magnitudes of both the first pass voltage Vpass1 and the second pass voltage Vpass2 decrease, whereas as the temperature falls, the magnitudes of both the first pass voltage Vpass1 and the second pass voltage Vpass2 increase. However, the slopes of the first pass voltage Vpass1 and the second pass voltage Vpass2 depending on the temperature change may be different from each other. For example, as illustrated in FIG. 11B, the absolute value of the slope of the second pass voltage Vpass2 depending on the temperature change may be greater than the absolute value of the slope of the first pass voltage Vpass1 depending on the temperature change.

Figure 12:
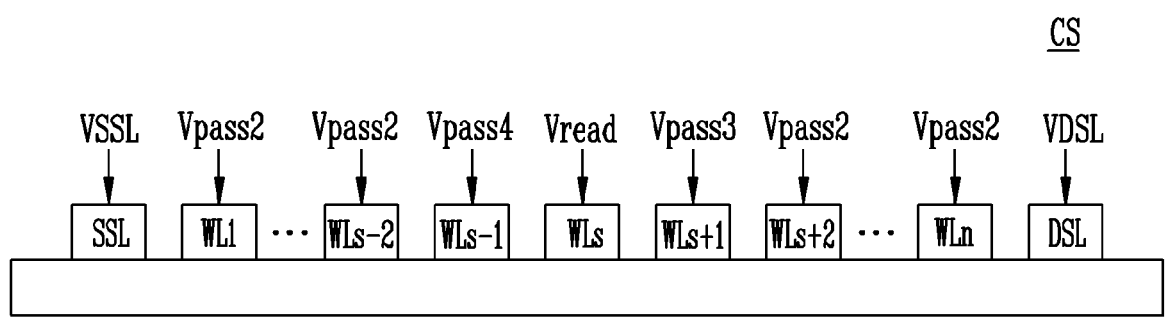
FIG. 12 is a diagram describing a read operation of a semiconductor memory device according to an embodiment of the present disclosure.

FIG. 12 is a diagram describing a read operation of a semiconductor memory device according to an embodiment of the present disclosure. Referring to FIG. 12, a cell string CS included in the memory cell array of the semiconductor memory device is illustrated. The cell string CS of FIG. 12 may be one of the cell strings CS11 to CS1m and CS21 to CS2m illustrated in FIG. 3. Alternatively, the cell string CS of FIG. 12 may be one of the cell strings CS11' to CS1m' and CS21' to CS2m' illustrated in FIG. 4. Alternatively, the cell string CS of FIG. 12 may be one of the cell strings CS1 to CSm illustrated in FIG. 5. In FIG. 12, a source select line SSL, a plurality of word lines WL1 to WLn, and a drain select line DSL, which are coupled to the cell string CS, are illustrated, and illustration of a common source line and bit lines is omitted.

During the read operation of the semiconductor memory device, a read voltage Vread is applied to a selected word line WLs, among the word lines WL1 to WLn coupled to the cell string CS. Meanwhile, a third pass voltage Vpass3 may be applied to the word line WLs+1 disposed adjacent to the selected word line WLs in the direction of the drain select line DSL, among the unselected word lines WL1 to WLs−1 and WLs+1 to WLn, and a fourth pass voltage Vpass4 may be applied to the word line WLs−1 disposed adjacent to the selected word line WLs in the direction of the source select line SSL, among the unselected word lines WL1 to WLs−1 and WLs+1 to WLn. A second pass voltage Vpass2 may be applied to the remaining unselected word lines WL1 to WLs−2 and WLs+2 to WLn other than the word lines WLs−1 and WLs+1 disposed adjacent to the selected word line WLs, among the unselected word lines WL1 to WLs−1 and WLs+1 to WLn. During the read operation, based on the read voltage Vread applied to the selected word line WLs, information is read about whether a threshold voltage of each memory cell coupled to the selected word line WLs is greater than the read voltage Vread. During a read operation, the second to fourth pass voltages Vpass2 to Vpass4 that are applied to the unselected word lines WL1 to WLs−1 and WLs+1 to WLn may be voltages greater than threshold voltages of all memory cells coupled to the unselected word lines WL1 to WLs−1 and WLs+1 to WLn. A source select line voltage VSSL applied to the source select line SSL during the read operation may be a voltage for turning on a source select transistor. Further, a drain select line voltage VDSL applied to the drain select line DSL during the read operation may be a voltage for turning on a drain select transistor. Although not illustrated, the control logic 140 may group the unselected word lines WL1 to WLs−1 and WLs+1 to WLn into a group, to which the adjacent pass voltages Vpass3 and Vpass4 are to be applied, and a group, to which the non-adjacent pass voltage Vpass2 is to be applied, whenever the word line WLs is selected for each read operation.

In the semiconductor memory device 100 according to an embodiment of the present disclosure, the third pass voltage Vpass3 to be applied to the word line WLs+1, among the unselected word lines WL1 to WLs−1 and WLs+1 to WLn, the fourth pass voltage Vpass4 to be applied to the word line WLs−1 thereamong, and the second pass voltage Vpass2 to be applied to the remaining unselected word lines WL1 to WLs−2 and WLs+2 to WLn thereamong may be separately used. In accordance with an embodiment of the present disclosure, a method of controlling the second to fourth pass voltages Vpass2 to Vpass4 depending on the temperature of the semiconductor device 100 will be described below with reference to FIGS. 13A to 13C.

Figure 13A:
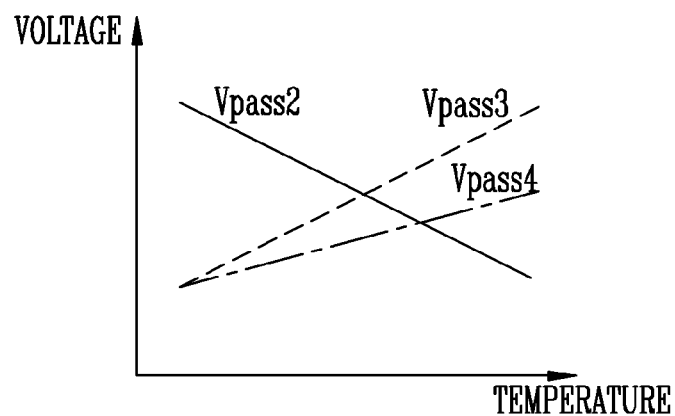
FIGS. 13A to 13C are graphs illustrating the relationships between pass voltages, used in a read operation of a semiconductor memory device, and temperature according to an embodiment of the present disclosure.
Figure 13B:
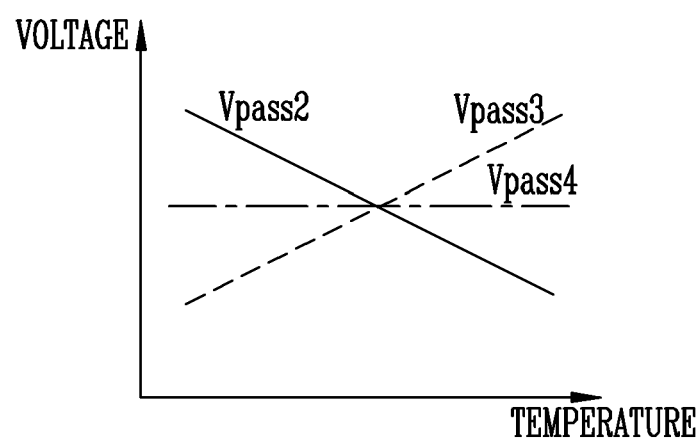
Figure 13C:
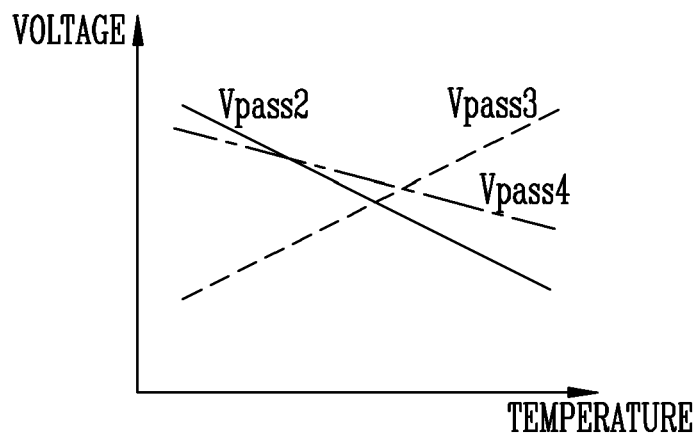

FIGS. 13A to 13C are graphs illustrating the relationships between pass voltages used in a read operation of a semiconductor memory device and temperature, according to an embodiment of the present disclosure, Referring to FIG. 13A, during the read operation of the semiconductor memory device according to an embodiment of the present disclosure, the magnitudes of second to fourth pass voltages Vpass2 to Vpass4 that are applied to unselected word lines WL1 to WLs−1 and WLs+1 to WLn depending on the temperature of the semiconductor memory device 100 are illustrated. As described above with reference to FIG. 12, the third pass voltage Vpass3 may be applied to the word line WLs+1 disposed adjacent to the selected word line WLs in the direction of a drain select line DSL, among the unselected word lines WL1 to WLs−1 and WLs+1 to WLn, and the fourth pass voltage Vpass4 may be applied to the word line WLs−1 disposed adjacent to the selected word line WLs in the direction of a source select line SSL thereamong. Meanwhile, the second pass voltage Vpass2 may be applied to the remaining unselected word lines WL1 to WLs−2 and WLs+2 to WLn thereamong. In accordance with an embodiment of the present disclosure, as the temperature of the semiconductor device 100 rises, the magnitudes of the third and fourth pass voltages Vpass3 and Vpass4 increase and the magnitude of the second pass voltage Vpass2 decreases. In contrast, as the temperature falls, the magnitudes of the third and fourth pass voltages Vpass3 and Vpass4 decrease and the magnitude of the second pass voltage Vpass2 increases. However, the slopes of the third pass voltage Vpass3 and the fourth pass voltage Vpass4 which increase depending on the temperature of the semiconductor device 100 may be different from each other. In FIG. 13A, it is illustrated that the slope of the third pass voltage Vpass3 that increases depending on the temperature is greater than that of the fourth pass voltage Vpass4. However, this is merely an example, and it is also possible to implement an embodiment configured such that the slope of the third pass voltage Vpass3 that increases depending on the temperature, is less than that of the fourth pass voltage Vpass4.

Referring to FIG. 13B, during the read operation of the semiconductor memory device according to an embodiment of the present disclosure, the magnitudes of second to fourth pass voltages Vpass2 to Vpass4 that are applied to unselected word lines WL1 to WLs−1 and WLs+1 to WLn depending on the temperature of the semiconductor memory device 100 are illustrated. Similar to the embodiment of FIG. 13A, as the temperature of the semiconductor device 100 rises, the magnitude of the third pass voltage Vpass3 increases and the magnitude of the second pass voltage Vpass2 decreases. In contrast, as the temperature falls, the magnitude of the third pass voltage Vpass3 decreases and the magnitude of the second pass voltage Vpass2 increases. However, unlike the embodiment of FIG. 13A, the fourth pass voltage Vpass4 may have a constant voltage level regardless of the temperature change.

In FIG. 13B, although an embodiment configured such that the magnitude of the third pass voltage Vpass3 increases with a rise in temperature and the fourth pass voltage Vpass4 has a constant voltage level regardless of the temperature change is illustrated, the present disclosure is not limited thereto. For example, it is also possible to implement an embodiment configured such that the magnitude of the fourth pass voltage Vpass4 increases with rise in temperature, and the third pass voltage Vpass3 has a constant voltage level regardless of the temperature change.

Referring to FIG. 13C, during the read operation of the semiconductor memory device according to an embodiment of the present disclosure, the magnitudes of second to fourth pass voltages Vpass2 to Vpass4 that are applied to unselected word lines WL1 to WLs−1 and WLs+1 to WLn depending on the temperature of the semiconductor memory device 100 are illustrated. Similar to the embodiment of FIG. 13A, as the temperature of the semiconductor device 100 rises, the magnitude of the third pass voltage Vpass3 increases and the magnitude of the second pass voltage Vpass2 decreases. In contrast, as the temperature falls, the magnitude of the third pass voltage Vpass3 decreases and the magnitude of the second pass voltage Vpass2 increases. However, unlike the embodiment of FIG. 13A, as the temperature rises, the magnitude of the fourth pass voltage Vpass4 may decrease. That is, as the temperature rises, the magnitudes of both the second pass voltage Vpass2 and the fourth pass voltage Vpass4 decrease, whereas as the temperature falls, the magnitudes of both the second pass voltage Vpass2 and the fourth pass voltage Vpass4 increase. However, the slopes of voltage change depending on the temperature change may differ from each other between the second pass voltage Vpass2 and the fourth pass voltage Vpass4. The slope of the second pass voltage Vpass2 depending on the temperature change may be greater than the slope of the fourth pass voltage Vpass4 depending on the temperature change.

Referring to the embodiments illustrated in FIGS. 9 to 13C, it is illustrated that the same second pass voltage Vpass2 is applied to unselected word lines WL1 to WLs−2 and WLs+2 to WLn which are not adjacent to the selected word line WLs. However, the present disclosure is not limited thereto, and different pass voltages may be applied to the unselected word lines WL1 to WLs−2 and WLs+2 to WLn which are not adjacent to the selected word line WLs.

Figure 14:
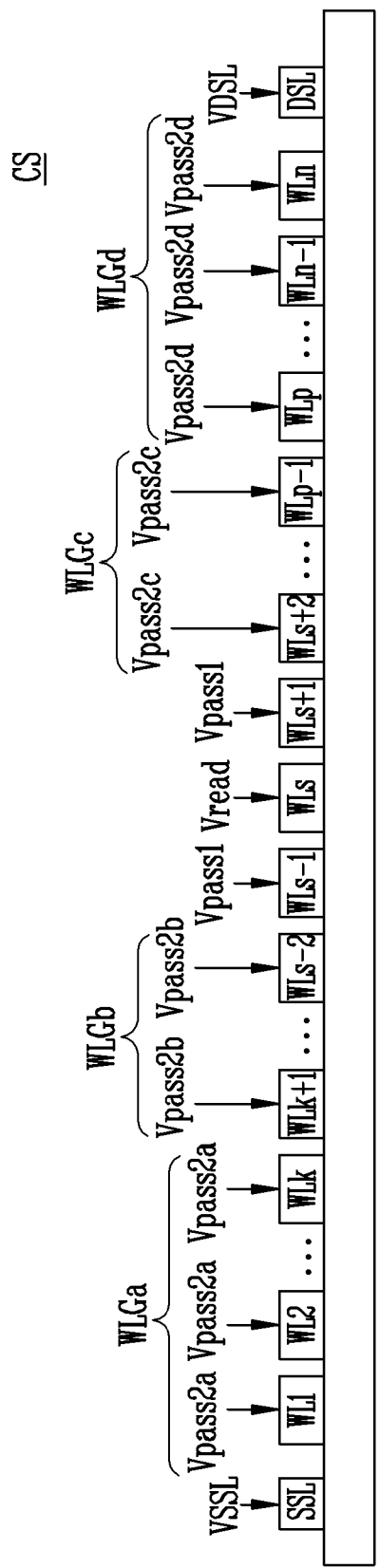
FIG. 14 is a diagram describing a read operation of a semiconductor memory device according to an embodiment of the present disclosure.

FIG. 14 is a diagram describing a read operation of a semiconductor memory device according to an embodiment of the present disclosure.

Referring to FIG. 14, a cell string CS included in the memory cell array of the semiconductor memory device is illustrated. The cell string CS of FIG. 14 may be one of the cell strings CS11 to CS1m and CS21 to CS2m illustrated in FIG. 3. Alternatively, the cell string CS of FIG. 14 may be one of the cell strings CS11' to CS1m' and CS21' to CS2m' illustrated in FIG. 4. Alternatively, the cell string CS of FIG. 14 may be one of the cell strings CS1 to CSm illustrated in FIG. 5. In FIG. 14, a source select line SSL, a plurality of word lines WL1 to WLn, and a drain select line DSL, which are coupled to the cell string CS, are illustrated, and illustration of a common source line and bit lines is omitted.

During the read operation of the semiconductor memory device, a read voltage Vread is applied to a selected word line WLs, among the word lines WL1 to WLn coupled to the cell string CS. Meanwhile, a first pass voltage Vpass1 may be applied to word lines WLs−1 and WLs+1 which are disposed adjacent to the selected word line WLs, among unselected word lines WL1 to WLs−1 and WLs+1 to WLn.

The unselected word lines WL1 to WLs−2 and WLs+2 to WLn which are not adjacent to the selected word line WLs, among unselected word lines WL1 to WLs−1 and WLs+1 to WLn, may be divided into a plurality of groups WLGa, WLGb, WLGc, and WLGd. A 2a-th pass voltage Vpass2a may be applied to unselected word lines WL1 to WLk belonging to the first group WLGa, among the plurality of groups WLGa, WLGb, WLGc, and WLGd, and a 2b-th pass voltage Vpass2b may be applied to unselected word lines WLk+1 to WLs−2 belonging to the second group WLGb, among the plurality of groups WLGa, WLGb, WLGc, and WLGd. Further, a 2c-th pass voltage Vpass2c may be applied to unselected word lines WLs+2 to WLp−1 belonging to the third group WLGc, among the plurality of groups WLGa, WLGb, WLGc, and WLGd, and a 2d-th pass voltage Vpass2d may be applied to unselected word lines WLp to WLn belonging to the fourth group WLGd, among the plurality of groups WLGa, WLGb, WLGc, and WLGd. In FIG. 14, although the embodiment in which the unselected word lines WL1 to WLs−2 and WLs+2 to WLn which are not adjacent to the selected word line WLs, among the unselected word lines WL1 to WLs−1 and WLs+1 to WLn, are divided into four groups WLGa, WLGb, WLGc, and WLGd is illustrated, the present disclosure is not limited thereto, and the number of groups and the number of word lines included in each group may be selected in various manners depending on the circumstances.

In the present disclosure, the first pass voltage Vpass1 that is applied to the word lines WLs−1 and WLs+1 which are disposed adjacent to the selected word line WLs may be referred to as an "adjacent pass voltage", and the 2a-th to 2d-th pass voltages Vpass2a to Vpass2d that are applied to the unselected word lines WL1 to WLs−2 and WLs+2 to WLn which are not disposed adjacent to the selected word line WLs may be referred to as "non-adjacent pass voltages." Although not illustrated, the control logic 140 may group the unselected word lines WL1 to WLs−1 and WLs+1 to WLn into a group, to which the adjacent pass voltage Vpass1 is to be applied, and the groups WLGa to WLGd, to which the non-adjacent pass voltages Vpass2a to Vpass2d are respectively to be applied, whenever the word line WLs is selected for each read operation.

Figure 15:
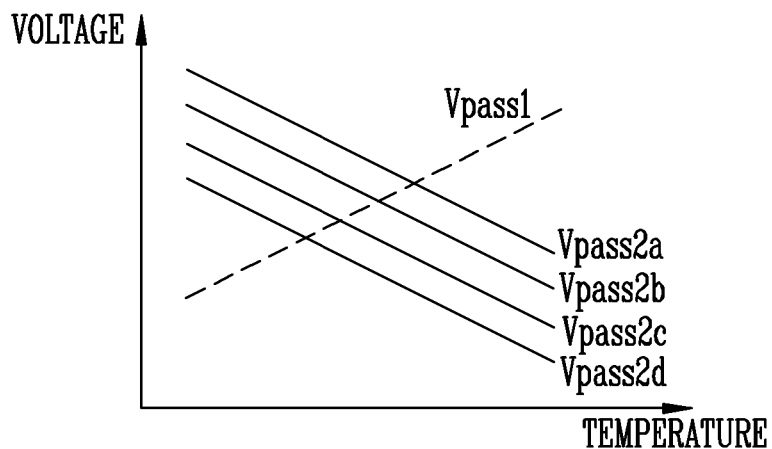
FIG. 15 is a graph illustrating the operating characteristics of a memory cell depending on temperature when the pass voltages of FIG. 14 are used.

FIG. 15 is a graph illustrating the operating characteristics of a memory cell depending on the temperature of the semiconductor device 100 when the pass voltages of FIG. 14 are used.

Referring to FIG. 15, during a read operation of a semiconductor memory device according to an embodiment of the present disclosure, the magnitudes of the first pass voltage Vpass1 and 2a-th to 2d-th pass voltages Vpass2a to Vpass2d that are applied to unselected word lines WL1 to WLs−1 and WLs+1 to WLn depending on the temperature of the semiconductor memory device 100 are illustrated. As described above with reference to FIG. 14, the first pass voltage Vpass1 may be applied to word lines WLs−1 and WLs+1 disposed adjacent to the selected word line WLs, among unselected word lines WL1 to WLs−1 and WLs+1 to WLn, and the 2a-th to 2d-th pass voltages Vpass2a to Vpass2d may be applied to the remaining unselected word lines WL1 to WLs−2 and WLs+2 to WLn, among the unselected word lines WL1 to WLs−1 and WLs+1 to WLn. In accordance with an embodiment of the present disclosure, as the temperature of the semiconductor device 100 rises, the magnitude of the first pass voltage Vpass1 increases and the magnitudes of the 2a-th to 2d-th pass voltages Vpass2a to Vpass2d decrease. In contrast, as the temperature falls, the magnitude of the first pass voltage Vpass1 decreases and the magnitudes of the 2a-th to 2d-th pass voltages Vpass2a to Vpass2d increase. In FIG. 15, although it is illustrated that, among the 2a-th to 2d-th pass voltages Vpass2a to Vpass2d, the 2a-th pass voltage Vpass2a has the largest magnitude and the 2d-th pass voltage Vpass2d has the smallest magnitude, this is merely an example, and the present disclosure is not limited thereto. For example, unlike the embodiment illustrated in FIG. 15, the magnitude of the 2d-th pass voltage Vpass2d may be the largest, and the magnitude of the 2a-th pass voltage Vpass2a may be the smallest. Respective relative magnitudes of the 2a-th to 2d-th pass voltages Vpass2a to Vpass2d may change in various manners as necessary.

Figure 16:
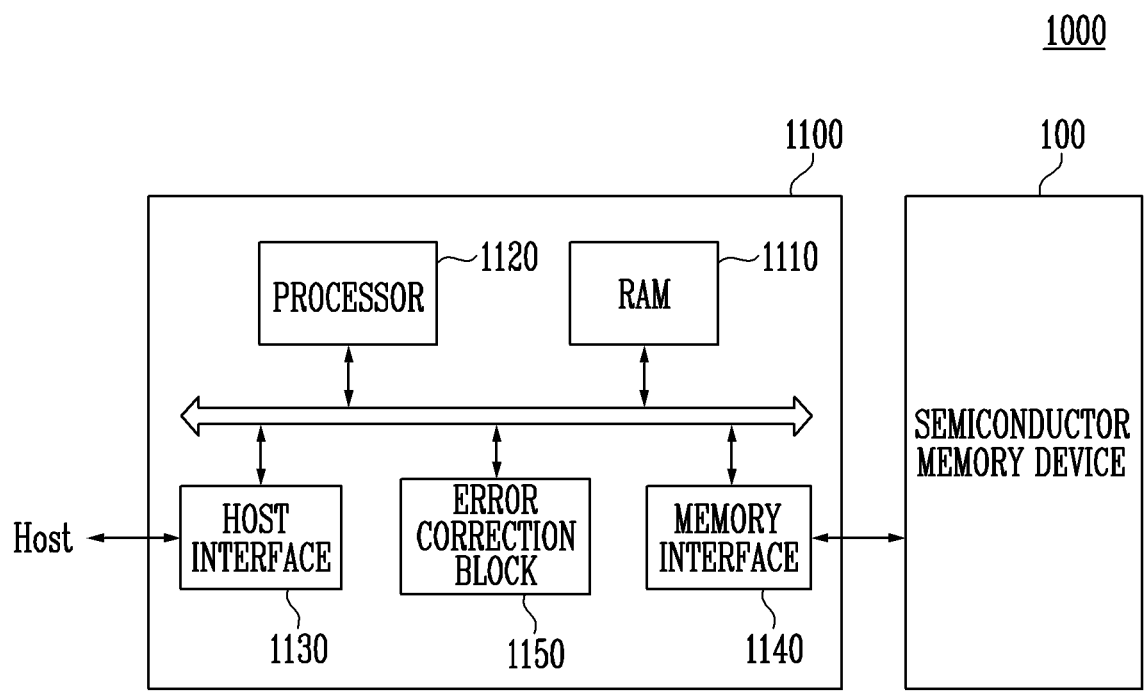
FIG. 16 is a block diagram illustrating a memory system 1000 including the semiconductor memory device 100 of FIG. 1.

FIG. 16 is a block diagram illustrating a memory system 1000 including the semiconductor memory device 100 of FIG. 1.

Referring to FIG. 16, the memory system 1000 may include the semiconductor memory device 100 and a memory controller 1100. The semiconductor memory device 100 may be the semiconductor memory device described with reference to FIG. 1. Hereinafter, repetitive descriptions will be omitted.

The memory controller 1100 is coupled to a host Host and the semiconductor memory device 100. The memory controller 1100 may access the semiconductor memory device 100 in response to a request from the host Host. For example, the memory controller 1100 may control read, write, erase, and background operations of the semiconductor memory device 100. The memory controller 1100 may provide an interface between the semiconductor memory device 100 and the host Host. The memory controller 1100 may run firmware for controlling the semiconductor memory device 100.

The memory controller 1100 includes a random access memory (RAM) 1110, a processor 1120, a host interface 1130, a memory interface 1140, and an error correction block 1150. The RAM 1110 is used as at least one of a working memory for the processor 1120, a cache memory between the semiconductor memory device 100 and the host Host, and a buffer memory between the semiconductor memory device 100 and the host. The processor 1120 may control the overall operation of the memory controller 1100. In addition, the memory controller 1100 may temporarily store program data provided from the host Host during a write operation.

The host interface 1130 includes a protocol for performing data exchange between the host Host and the memory controller 1100. In an embodiment, the memory controller 1100 may communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface may include a NAND interface or NOR interface.

The error correction block 1150 may detect and correct errors in data received from the semiconductor memory device 100 using an error correction code (ECC). In an example embodiment, the error correction block may be provided as an element of the memory controller 1100.

The memory controller 1100 and the semiconductor memory device 100 may be integrated into a single semiconductor device. In an embodiment, the memory controller 1100 and the semiconductor memory device 100 may be integrated into a single semiconductor device to form a memory card. For example, the memory controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The memory controller 1100 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification device (RFID), or one of various elements for forming a computing system.

In an embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 17:
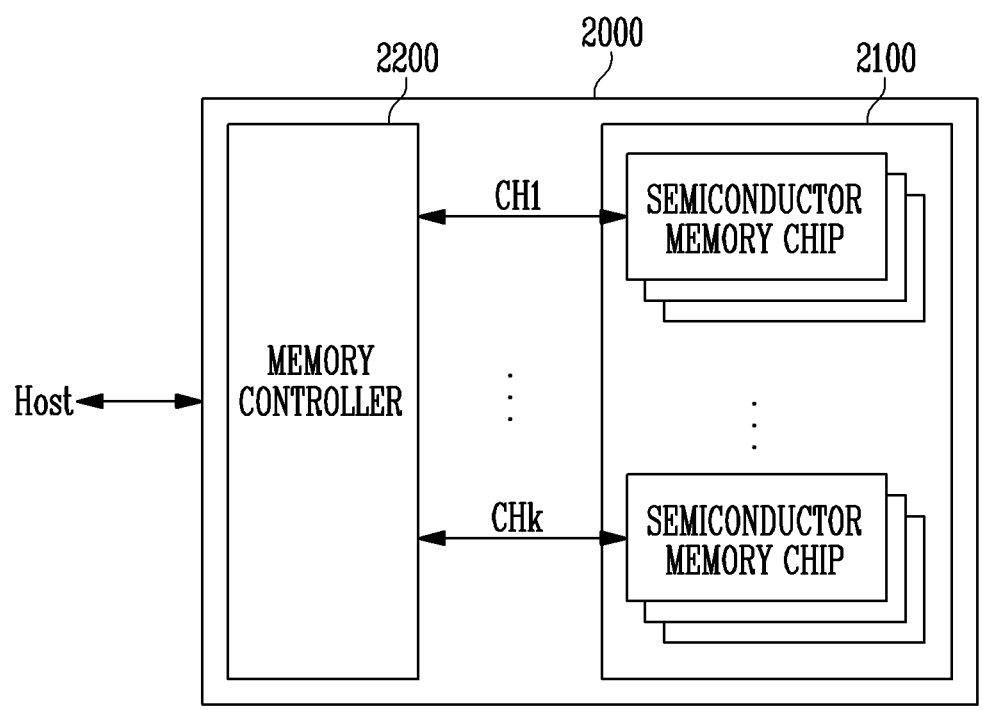
FIG. 17 is a block diagram illustrating an example of application of the memory system of FIG. 16.

FIG. 17 is a block diagram illustrating an example of application of the memory system of FIG. 16.

Referring to FIG. 17, the memory system 2000 may include the semiconductor memory device 2100 and a memory controller 2200. The semiconductor memory device 2100 may include a plurality of semiconductor memory chips. The semiconductor memory chips are divided into a plurality of groups.

In FIG. 17, it is illustrated that the plurality of groups communicate with the memory controller 2200 through first to k-th channels CH1 to CHk. Each semiconductor memory chip may be configured and operated in the same manner as those of the semiconductor memory device 100 described with reference to FIG. 1.

Each group may communicate with the memory controller 2200 through one common channel. The memory controller 2200 may have the same configuration as the memory controller 1100 described with reference to FIG. 16, and may control the plurality of memory chips of the semiconductor memory device 2100 through the plurality of channels CH1 to CHk.

Figure 18:
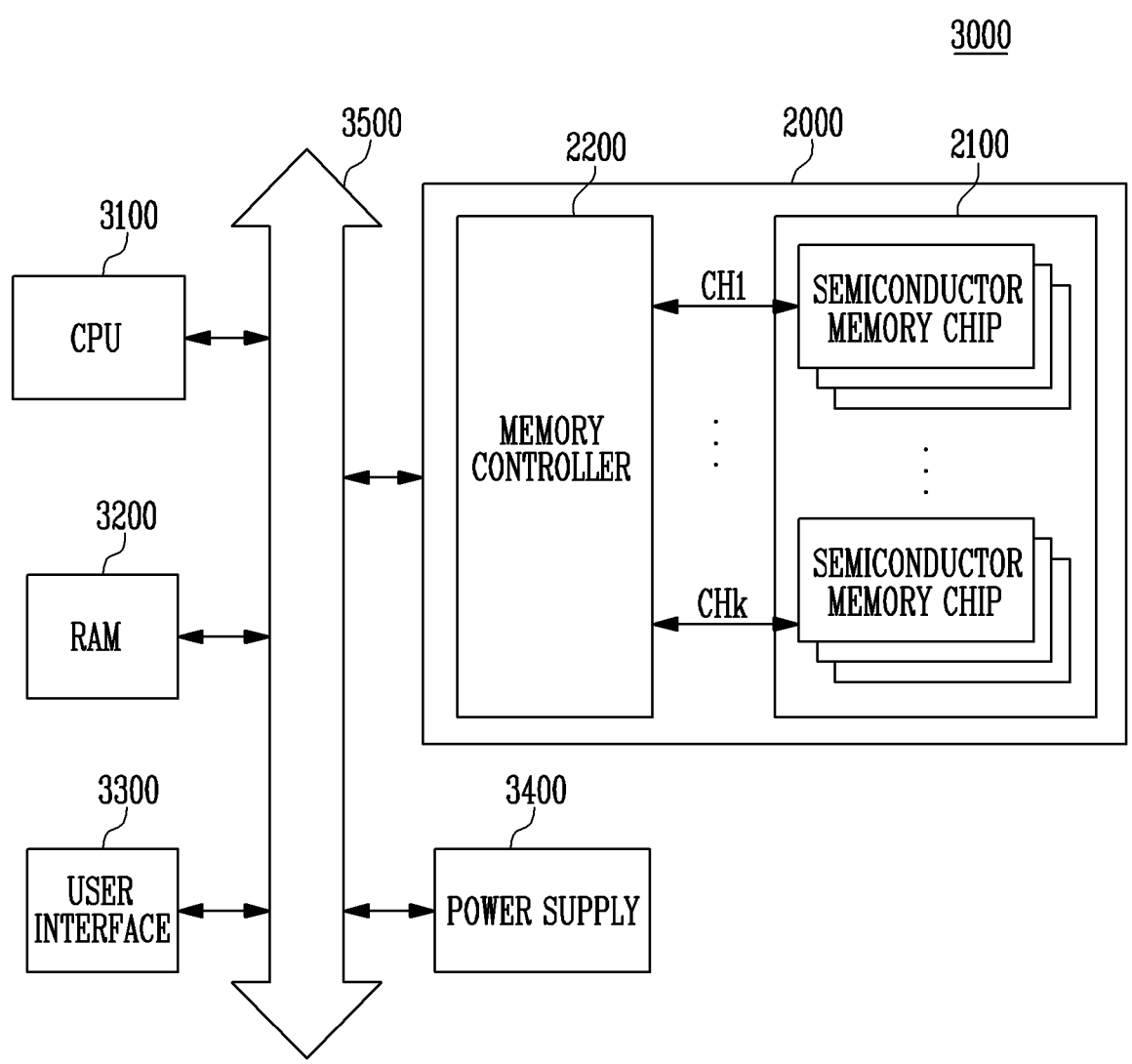
FIG. 18 is a block diagram illustrating a computing system including the memory system described with reference to FIG. 17.

FIG. 18 is a block diagram illustrating a computing system including the memory system described with reference to FIG. 17.

A computing system 3000 includes a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 18, a semiconductor memory device 2100 is illustrated as being coupled to the system bus 3500 through the memory controller 2200. However, the semiconductor memory device 2100 may be directly coupled to the system bus 3500. Here, the function of the memory controller 2200 may be performed by the CPU 3100 and the RAM 3200.

In FIG. 18, the memory system 2000 described with reference to FIG. 17 is illustrated as being provided. However, the memory system 2000 may be replaced with the memory system 1000 described with reference to FIG. 16. In an embodiment, the computing system 3000 may include both the memory systems 1000 and 2000 described with reference to FIGS. 16 and 17.

The present disclosure may provide a semiconductor memory device having improved read performance depending on a temperature change.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a memory cell array including a plurality of memory cells;
   a peripheral circuit configured to perform a read operation on the plurality of memory cells; and
   a control logic configured to control the read operation of the peripheral circuit,
   wherein, during the read operation, the control logic controls the peripheral circuit so that a read voltage is applied to a selected word line among a plurality of word lines coupled to the plurality of memory cells, a first pass voltage is applied to an unselected word line disposed adjacent to the selected word line among the plurality of word lines, and a second pass voltage is applied to an unselected word line that is not disposed adjacent to the selected word line among the plurality of word lines, and wherein the peripheral circuit is further configured to adjust a magnitude of the first pass voltage or a magnitude of the second pass voltage based on a temperature of the semiconductor memory device, wherein the peripheral circuit comprises:

a voltage generator configured to generate the read voltage, the first pass voltage, and the second pass voltage;

an address decoder configured to transfer the read voltage, the first pass voltage, and the second pass voltage to the selected word line, the unselected word line disposed adjacent to the selected word line and the unselected word line that is not disposed adjacent to the selected word line, respectively;

a read and write circuit configured to sense threshold voltages of memory cells coupled to the selected word line; and a temperature sensor configured to sense the temperature and generate a temperature code based on the temperature, wherein the voltage generator is further configured to adjust the magnitude of the first pass voltage or the magnitude of the second pass voltage based on the temperature code.

2. A semiconductor memory device, comprising:

a memory cell array including a plurality of memory cells;

a peripheral circuit configured to perform a read operation on the plurality of memory cells; and a control logic configured to control the read operation of the peripheral circuit, wherein, during the read operation, the control logic controls the peripheral circuit so that a read voltage is applied to a selected word line among a plurality of word lines coupled to the plurality of memory cells, a first pass voltage is applied to an unselected word line disposed adjacent to the selected word line among the plurality of word lines, and a second pass voltage is applied to an unselected word line that is not disposed adjacent to the selected word line among the plurality of word lines, wherein the peripheral circuit is further configured to adjust a magnitude of the first pass voltage or a magnitude of the second pass voltage based on a temperature of the semiconductor memory device, and wherein the peripheral circuit decreases the magnitude of the second pass voltage as the temperature rises.

3. The semiconductor memory device according to claim 2, wherein the peripheral circuit increases the magnitude of the first pass voltage as the temperature rises.

4. The semiconductor memory device according to claim 2, wherein the peripheral circuit keeps the first pass voltage constant regardless of the temperature.

5. The semiconductor memory device according to claim 2, wherein the peripheral circuit decreases the magnitude of the first pass voltage as the temperature rises.

6. The semiconductor memory device according to claim 5, wherein the peripheral circuit adjusts the magnitudes of the first pass voltage and the second pass voltage so that an absolute value of a slope of the second pass voltage depending on the rise of the temperature is greater than an absolute value of a slope of the first pass voltage depending on the rise.

7. A semiconductor memory device, comprising:

a memory cell array including a plurality of memory cells;

a peripheral circuit configured to perform a read operation on the plurality of memory cells; and a control logic configured to control the read operation of the peripheral circuit, wherein, during the read operation, the control logic controls the peripheral circuit so that a read voltage is applied to a selected word line among a plurality of word lines coupled to the plurality of memory cells and so that a first pass voltage is applied to an unselected word line disposed adjacent to the selected word line in a direction of a drain select line among the plurality of word lines, a second pass voltage is applied to an unselected word line disposed adjacent to the selected word line in a direction of a source select line among the plurality of word lines, and a third pass voltage is applied to an unselected word line that is not disposed adjacent to the selected word line among the plurality of word lines, and wherein the peripheral circuit is further configured to adjust a magnitude of at least one of the first pass voltage, the second pass voltage and the third pass voltage based on a temperature of the semiconductor memory device.

8. The semiconductor memory device according to claim 7, wherein the peripheral circuit comprises:

a voltage generator configured to generate the read voltage, the first pass voltage, the second pass voltage and the third pass voltage;

an address decoder configured to transfer the read voltage and the first pass voltage, the second pass voltage and the third pass voltage to the selected word line, the unselected word line disposed adjacent to the selected word line in the direction of the drain select line, the unselected word line disposed adjacent to the selected word line in the direction of the source select line and the unselected word line that is not disposed adjacent to the selected word line, respectively;

a read and write circuit configured to sense threshold voltages of memory cells coupled to the selected word line; and a temperature sensor configured to sense the temperature and generate a temperature code based on the temperature, wherein the voltage generator is further configured to adjust the magnitude of at least one of the first to third pass voltages based on the temperature code.

9. The semiconductor memory device according to claim 7, wherein the peripheral circuit decreases the magnitude of the third pass voltage as the temperature rises.

10. The semiconductor memory device according to claim 9, wherein the peripheral circuit increases the magnitudes of the first and second pass voltages as the temperature rises.

11. The semiconductor memory device according to claim 10, wherein the peripheral circuit adjusts the magnitudes of the first pass voltage and the second pass voltage so that a slope of the first pass voltage depending on the rise of the temperature is greater than a slope of the second pass voltage depending on the rise.

12. The semiconductor memory device according to claim 10, wherein the peripheral circuit adjusts the magnitudes of the first pass voltage and the second pass voltage so that a slope of the second pass voltage depending on the rise of the temperature is greater than a slope of the first pass voltage depending on the rise.

13. The semiconductor memory device according to claim 9,
wherein the peripheral circuit increases the magnitude of the first pass voltage as the temperature rises, and
wherein the peripheral circuit keeps the second pass voltage constant regardless of the temperature.

14. The semiconductor memory device according to claim 9,
wherein the peripheral circuit increases the magnitude of the second pass voltage as the temperature rises, and
wherein the peripheral circuit keeps the first pass voltage constant regardless of the temperature.

15. The semiconductor memory device according to claim 9, wherein the peripheral circuit increases the magnitude of the first pass voltage and decreases the magnitude of the second pass voltage, as the temperature rises.

16. The semiconductor memory device according to claim 15, wherein the peripheral circuit adjusts the magnitudes of the second pass voltage and the third pass voltage so that an absolute value of a slope of the third pass voltage depending on the rise of the temperature is greater than an absolute value of a slope of the second pass voltage depending on the rise.

17. The semiconductor memory device according to claim 9, wherein the peripheral circuit decreases the magnitude of the first pass voltage and increases the magnitude of the second pass voltage as the temperature rises.

18. The semiconductor memory device according to claim 17, wherein the peripheral circuit adjusts the magnitudes of the first pass voltage and the third pass voltage so that an absolute value of a slope of the third pass voltage depending on the rise of the temperature is greater than an absolute value of a slope of the first pass voltage depending on the rise.

19. An operating method of a semiconductor memory device including a memory cell string of memory cells, the operating method comprising:
grouping non-target word lines into near and far groups each including one or more word lines, the near group being disposed closer to a target word line than the far group and the target and non-target word lines being coupled respectively to the memory cells;
applying an operation voltage to the target word line;
applying one or more near voltages respectively to the near group; and
applying one or more far voltages respectively to the far group,
wherein the applying of the far voltages includes changing the far voltages in negative proportion to a temperature of the semiconductor memory device, and
wherein the applying of the near voltages includes changing at least one of the near voltages in positive proportion to the temperature.

20. The operating method of claim 19, wherein the applying of the near voltages further includes changing another one of the near voltages in different positive proportion to the temperature.

21. The operating method of claim 19, wherein the applying of the near voltages further includes keeping another one of the near voltages constant with reference to the temperature.

22. The operating method of claim 19,
wherein the applying of the near voltages further includes changing another one of the near voltages in negative proportion to the temperature, and
wherein gradients of the far voltages during the changing of the far voltages are greater than a gradient of the another near voltage during the changing of the another near voltage.

23. An operating method of a semiconductor memory device including a memory cell string of memory cells respectively coupled to word lines, the operating method comprising:
grouping remaining word lines other than a target word line into near and far groups each including one or more word lines, the near group disposed closer to the target word line than the far group;
applying an operation voltage to the target word line;
applying one or more near voltages respectively to the near group; and
applying one or more far voltages respectively to the far group,
wherein the applying the far voltages includes changing the far voltages in negative proportion to a temperature of the semiconductor memory device, and
wherein the applying the near voltages includes keeping at least one of the near voltages constant with reference to the temperature.

24. The operating method of claim 23, wherein the applying the near voltages further includes changing another one of the near voltages in positive proportion to the temperature.

25. An operating method of a semiconductor memory device including a memory cell string of memory cells respectively coupled to word lines, the operating method comprising:
grouping remaining word lines other than a target word line into near and far groups each including one or more word lines, the near group disposed closer to the target word line than the far group;
applying an operation voltage to the target word line;
applying one or more near voltages respectively to the near group; and
applying one or more far voltages respectively to the far group,
wherein the applying the far voltages includes changing the far voltages in negative proportion to the temperature,
wherein the applying the near voltages includes changing at least one of the near voltages in negative proportion to a temperature of the semiconductor memory device, and
wherein gradients of the far voltages during the changing of the far voltages are greater than a gradient of the near voltage during the changing of the near voltage.

26. The operating method of claim 25, wherein the applying the near voltages further includes changing another one of the near voltages in positive proportion to the temperature.

* * * * *